United States Patent [19]
Haberland

[11] Patent Number: 5,110,435
[45] Date of Patent: May 5, 1992

[54] APPARATUS AND PROCESS FOR PRODUCING A THIN LAYER ON A SUBSTRATE

[76] Inventor: Helmut Haberland, Laireweg 17a, D-7805 Botzingen, Fed. Rep. of Germany

[21] Appl. No.: 585,083
[22] PCT Filed: Mar. 22, 1989
[86] PCT No.: PCT/DE89/00179
  § 371 Date: Sep. 21, 1990
  § 102(e) Date: Sep. 21, 1990
[87] PCT Pub. No.: WO89/09293
  PCT Pub. Date: Oct. 5, 1989

[30] Foreign Application Priority Data
  Mar. 23, 1988 [DE] Fed. Rep. of Germany ....... 3809734

[51] Int. Cl.⁵ .............................................. C23C 14/34
[52] U.S. Cl. ........................... 204/192.31; 204/192.12; 204/298.05; 204/298.06
[58] Field of Search ...................... 204/192.11, 192.31, 204/298.04, 298.05, 298.06, 192.12, 298.01, 298.02; 427/38; 118/723

[56] References Cited
U.S. PATENT DOCUMENTS

| | | | |
|---|---|---|---|
| 4,389,299 | 6/1983 | Adachi et al. | 204/298.05 X |
| 4,687,939 | 8/1987 | Miyauchi et al. | 204/298.05 X |
| 4,692,230 | 9/1987 | Nihei et al. | 204/298.05 X |
| 4,919,779 | 4/1990 | Mizoguchi et al. | 204/298.05 X |
| 4,925,542 | 5/1990 | Kida | 204/298.06 X |
| 4,966,095 | 10/1990 | Ohta et al. | 204/298.05 X |

FOREIGN PATENT DOCUMENTS
96265 6/1984 Japan .............................. 204/298.05

*Primary Examiner*—Nam Nguyen
*Attorney, Agent, or Firm*—Sprung Horn Kramer & Woods

[57] ABSTRACT

Ionized cluster beam (ICB) deposition has received considerable attention since its introduction in 1972 by Takagi et al, at Kyoto University because of its potential for low temperature film growth. While further investigation of many aspects of ICB deposition is warranted, it is first necessary to determine with some certainty whether large clusters are being produced. A complete analysis of the Eaton ICB source involving computer calculation of the potential fields and computer simulation of the electrons and ions as they react to and influence these fields provides an in-depth understanding of the dynamics that influence the final ion beam characteristics. A high resolution time-of-flight mass spectrometer was developed to experimentally investigate the cluster size distribution. No evidence of large clusters was found down to a level more than two orders of magnitude below what the Kyoto University group has reported. A computer analysis of the three Kyoto University cluster size experiments that form the foundation of ICB has shown that the potential fields in the ionization areas are critically distorted by either space-charge effects or design flaws, both of which are serious enough to invalidate the experiments. The theory behind large cluster production and the body of indirect evidence attributed to the presence of large clusters are not convincing by themselves so it is concluded that a Takagi-type source does not produce large clusters in quantities capable of affecting film growth.

17 Claims, 3 Drawing Sheets

APPARATUS AND PROCESS FOR PRODUCING A THIN LAYER ON A SUBSTRATE

The invention relates to an apparatus for producing a thin layer of a coating material on a substrate with a vacuum chamber containing a holding means for the substrate, a cluster generating device for generating clusters of the coating material, an ionization device for ionizing the clusters and an accelerating device, which is provided with at least one electrode for accelerating the cluster ions by means of an electric field along an acceleration path in the direction towards the substrate.

The invention is further directed to a process for producing a thin layer of a coating material on a substrate which comprises generating clusters of the coating material and accelerating the clusters towards the substrate by means of an electric field.

Thin layers are produced under vacuum conditions according to different known processes. Examples are the vapor-deposition process and the sputtering process. During the vapor-deposition the substrate is placed near an open crucible in which the vaporization material is heated. In the sputtering process particles, perferably atomic ions, are shot on a solid surface of the coating material (sputter target), thereby releasing atomic or low molecular particles of the coating material which precipitate on the substrate placed near the sputter target. The sputtering is also called "atomizing", however, the English term is used as well in the German language so that in the following this term will be used exclusively.

A further known process is the cluster-ion-epitaxy in which not single atoms are deposited on the substrate surface but the atoms leaving a vaporization crucible first are combined to form so-called "clusters." Thereby the layer surface is said to be improved. The clusters are partially ionized and thereafter deposited on the substrate to be coated.

Cluster is a term used in physics for aggregations of a plurality of atoms or molecules. The number of atoms or molecules forming a cluster may vary considerably. In a typical case the order of magnitude is between 10 and $10^5$.

From German Auslegeschrift 26 28 366, there is known a cluster-ion-epitaxy process in which a closed melting crucible is used having a small aperture serving as injection nozzle. The crucible is heated under vacuum conditions and the particles passing through the injection nozzle expand very quickly. By this so-called adiabatic expansions clusters are formed which subsequently are ionized by means of an electron current from a heated wire. The ionized clusters are accelerated towards the substrate in an electric field.

For producing layers having excellent optical, electrical and mechanical properties it is very important that the layers are coated in a clean way and without impurities caused by the process. The cleaner the layers are the better is their quality in general.

The known cluster-ion-epitaxy processes do not satisfy the demands in this respect. The impurities caused by the process are especially high. They are caused e.g. by the crucible material, reaction products of the crucible material with the substance to be vaporized and reaction products of the crucible material with eventually present reactive gases. Moreover, incrustations of the nozzle may lead to disadvantageous alterations of the process parameters.

The invention therefore has the task to provide a process and an apparatus for the production of thin layers having improved quality at reasonable expense.

This problem is solved by an apparatus as described at the beginning in which the cluster generating device is provided with a sputter unit having a sputter target consisting of solid coating material for transferring the coating material into the gas phase and an aggregation chamber having a gas feeding conduit, the acceleration device being placed in an acceleration chamber separated from the aggregation chamber and being connected with the aggregation chamber by an aperture for the clusters arranged in an extension of the acceleration path, a vacuum pump being in communication with the acceleration chamber being set by controlling the gas feed and the vacuum pump throughput in such way that clusters of the coating materials are formed by collisions of the gas atoms.

A process as described in the beginning is further developed according to the invention in that for generating the ionized clusters the coating material is transferred into the gas phase by sputtering and the particles developed move into a gas atmosphere in which the clusters are formed by collisions of the gas atoms.

For aggregating the clusters noble gases and their mixtures, especially helium-argon mixtures are suitable in the first line. However, other gases like nitrogen or hydrocarbons may also be used as aggregation gases.

The invention is superior in many aspects as compared to known processes and apparatuses:

1. It can be used for a plurality of coating materials (metals, semi-conductors and insulators). In particular there can be used high-melting materials (tungsten, tantalum, titanium), for which the known cluster-ion-epitaxy process is absolutely unsuitable.
2. Since there are not used any crucibles or thermal processes for transferring the material into the gas phase there will be no impurities.
3. Since sputter electrodes are usually water-cooled, the vacuum of the apparatus is not impaired by the heating of parts inside the vacuum chamber.
4. Since no nozzle is used for cluster generation there will be no such disadvantages like incrustation or erosion.
5. The coating process can be controlled nearly inertialess by controlling the sputter rate, whereas in the known process a quick control was impossible due to the thermal inertia of the masses. The process automation is considerably facilitated by the quick controllability. To a certain extent it is possible to produce entirely new coating compositions.
6. The direction of the cluster jet directed to the substrate is arbitrary, whereas the known process allows only a vertical jet. This facilitates the construction of the entire system.

The sputtering of the coating material can be effected according to different known processes, as described e.g. in "Dünnschichttechnologie", VDI-Verlag, Düsseldorf, 1987, by H. Frey and G. Dienel. A focussed ion beam from a respective ion source, for example, may be directed to the surface of the sputter target.

A gas discharge is especially preferred for sputtering. In this way relatively high coating rates can be achieved with small expense relating to the apparatus.

The invention is further explained in the following on the basis of embodiments schematically represented in the figures.

Figure 1:
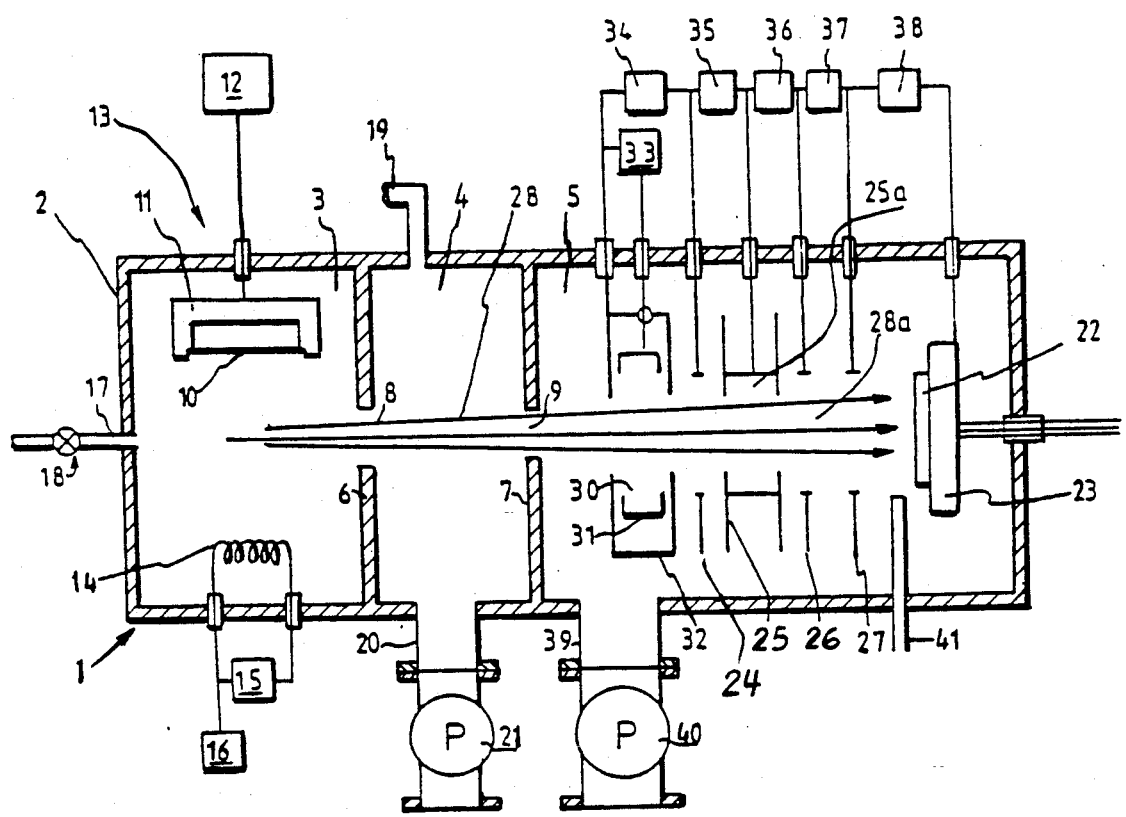
FIG. 1 is a cross-sectional representation of an apparatus according to the invention.

The cluster-ion-epitaxy-apparatus 1 represented in figure 1 consists of a vacuum housing 2 in which three chambers, namely a sputter chamber 3, an aggregation chamber 4 and an acceleration chamber 5 are separated from each other by separating walls 6,7. Each one of the separating walls 6,7 have apertures 8,9 in their center connecting on the one hand sputter chamber 3 with aggregation chamber 4, and on the on the other hand aggregation chamber 4 with acceleration chamber 5.

In the sputter chamber 3 the sputter target 10 is arranged in a holding means 11. Together with the power unit 12 these form a sputter unit 13. In the sputter chamber 3 there is also provided a filament 14 being connected with a heating power supply 15 and an accelerating voltage power supply 16.

By conduit 17 a gas serving as an aggregation gas and controlled by valve 18 can be fed into sputter chamber 3. In the following reference is made to a noble gas as aggregation gas for the cluster aggregation.

A conduit 19 is provided at the aggregation chamber through which, if the need occurs, additional gases can be fed. A vacuum pump 21 is connected with aggregation chamber 4 via connecting piece 20.

The substrate 22 to be coated is placed in the acceleration chamber 5 on a holding means 23 being mounted to the housing 2. Four accelerating and focussing electrodes 24–27 angularly surround the flight path symbolized by arrows 28. The partial path 28a of flight path 28 running through the acceleration electrodes is called the acceleration path.

In front of the acceleration path there is an ionization unit 30 consisting in the case represented of a cathode 31 and an auxiliary anode 32. Power supplies 33–38 feed the electrodes provided in the acceleration chamber 5.

A vacuum pump 40 is connected with the acceleration chamber 6 via a connecting piece 39. An additional gas supply is possible via conduct 41.

When the power supply 12 is switched on and the sputter target is set under negative voltage with respect to the housing, a gas discharge in the surrounding of the target (which is also called "sputter cathode") takes place. Thereby noble gas atoms are ionized by collisions with electrons and accelerated onto the surface of the sputter target 10. The impact causes atoms and to a slight extent smaller molecule fragments to be taken off the surface of the target by means of thermal vaporization as well as by direct momentum transfer. The major part of the particles (normally more than 99%) are neutral atoms.

Details of the different possible sputtering processes need not be described since they are known. Attention is drawn e.g. to the book of Frey and Kienel described in the beginning, where in paragraph 4.7 "Kathodenzerstäubung (cathode atomization)" numerous processes are described in detail.

If desired, the sputtering process may be supported in that the heating filament 14 is switched on. The electrons emerging from heating filament 14 support the generation of ions in the sputtering process and therefore increase the sputtering yield. There may be used alternatively or additionally to the electron source 14 an ion source in the sputter chamber 3 from which ions are accelerated onto the sputter target 10.

Through conduit 17, controlled by valve 18, a noble gas is fed. It streams through the apertures 8 and 9 and is exhausted from the acceleration chamber 5 by pump 40. The pressure of the noble gas in the chambers 3, 4 and 5 is determined by the supply rate of the noble gas, the size of the apertures and the pump rate of the pump 10 as well as pump 21 (if on duty) and may be set by altering these parameters. It is possible to feed gas through the conduit 19 and/or to exhaust it by means of the pump 21 for independently increasing or lowering the pressure in the aggregation chamber 4.

The relatively quick atoms emerging from the sputtering target (kinetic energy typically some 0 to 20 eV) are quickly accelerated by collisions with the gas particles and transported with the gas stream through the aperture 8 into the aggregation chamber 4 and further along the flight path 28 into the acceleration chamber 5. Thereby the atoms of the coating material aggregate in the gas stream to form clusters. This takes place mainly in the aggregation chamber 4 but also already in the sputtering chamber 3.

The cluster formation by means of the gas aggregation is a known physical phenomenon which is described in the article off. Frank et al., "Formation of Metal Clusters and Molecules by means of the Gas Aggregation Technique and Characterization of Size Distribution" in Surface Science, 1985, pages 90–99. The aggregation is based essentially on the fact that the cluster forming particles collide in a sufficiently high supersaturated condition with the noble gas particles and that the surplus energy generated during the cluster formation is withdrawn thereby.

The selection of the process parameters is important for the cluster formation. The density of the coating material in the gas stream is influenced essentially by the sputtering rate and the flow rate of the gas. The latter depends on the pressure conditions and the size of the apertures 8 and 9. The pressure of argon in the chambers 3 and 4 is especially significant for the formation of the clusters. Due to the information given in the specification and the cited literature the man skilled in the art may determine theoretically and experimentally which parameters have to be selected in each individual case, taking into consideration the coating material, the noble gas used and the coating rate desired. It may be taken as a reasonable first approximation that the pressure of the noble gas in the sputter chamber may be of the order of 10 to 1 Pa (Pascal) and in the acceleration chamber 5 of the order of $10^{-2}$ to $10^{-4}$ Pa. The pressure in the aggregation chamber in general is between these values.

The formed clusters and the not aggregated atoms and molecules are partially ionized when passing through the ionization unit 30. The ionization unit 30 may be constructed according to different known principles. There may be used an ionized particle beam, for example. However, the ionization unit is preferably based on the principle of gas discharge.

The cluster ions are accelerated by the electric field generated by the electrodes 24 to 27 and impinge on the substrate 22. The type of coating may be influenced by the acceleration voltage. At a high acceleration voltage the clusters break apart, diffuse laterally and form a coating being essentially monocrystalline. At a low acceleration voltage the clusters partially survive the impingement on the substrate surface and inhomogeneous layers are formed. There may be formed monocrystalline, polycrystalline and amorphous layers by selecting the respective acceleration voltage.

As mentioned before, not only clusters but also atoms and molecules (of the gases as well as of the coating material) get into the acceleration chamber 6, so that they, too, are ionized and accelerated in the acceleration path 28a. These ions are much lighter than the clusters and thus have a much higher speed after the acceleration than clusters. Their impact may damage or destruct the surface of the substrate by undesired sputtering processes. This can be avoided by the following preferred measures.

A first measure makes use of the fact that ionization potentials of the clusters generally are smaller than those of the atoms and molecules. Therefore it is suitable to select the ionization energy of the ionization unit 30 in such a way that it is above the ionization energy of the clusters, but lower than the ionization energy of the atoms and molecules. If the ionization takes place by means of a gas discharge, the gas discharge is selected to have a respectively low electron temperature.

As a second measure it is suitable to slowly accelerate the one with a plurality of electrodes 24-27. By this measure the light ions stay longer in an energetic range in which the effective cross section for the charge exchange with neutral atoms is large. The charge exchange causes an effective deceleration of the ions since the more rapid ion transfers its charge to the slower atom. The slower ion generated thereby is again accelerated until a further exchange of the charge takes place. After n charge exchange collisions at an applied voltage of U Volt $(n-1)$ neutral atoms and one ion having a medium energy of $U/n$ impinge onto the surface of substrate 22. The medium impinging energy per atom therefore is the smaller the larger the number of charge exchange collisions is there are.

As third measure there may be provided a charge exchange cell at one of the electrodes of the acceleration unit. In FIG. 1 a charge exchange cell 25a is arranged at the electrode 25. Cell 25a is supplied through a not represented conduit with neutral gas by which the rapid ions are decelerated by charge exchange. The atomic ions have an essentially larger charge exchange than the clusters and therefore are much more decelerated than those.

Another preferred embodiment of the invention provides that the noble gas is fed through the conduit 17 not in a continuous way but in a pulsating way. This results in high cluster formation and hence a relatively quick coating with a relatively small pump rate of the vacuum pumps. The medium nucleus formation rate rises overproportionally with the gas pressure. If the gas pressure is increased by a factor of ten, the cluster formation may rise e.g. by a factor of 100 to 1000. However, the pressure increase which is desired per se is limited by the possible or economically acceptable vacuum pump performance. An excellent medium cluster formation rate may be obtained if high amounts of gas are fed in a pulsating way for achieving the desired high pressure and if between the pulses the gas stream is reduced heavily for not overloading the pumps.

The invention may be used with different coating materials and noble gases. There are special advantages when coating high-melting materials like tantalum, tungsten, molybdenum and titanium. There may be used insulating coating materials as well. In such case it may be suitable to take specific measures for preventing disturbing space charges (operating the sputter unit with alternating current, in particular high frequency sputtering; periodically changing generation of positively and negatively charged ion clusters; supply of electrons into the area of the substrate). These measures may be of advantage also when coating noninsulators.

When producing coatings consisting of compounds (oxides, nitrides, hydrides) suitable reactive gases (oxygen, nitrogen, hydrogen) may be fed through conduits 19 and 41.

In the embodiment represented in FIG. 1, a sputter chamber 3 separated from the aggregation chamber 4 is used. This is advantageous for it allows separated adjustment of the pressures in both chambers. However, a joint sputter and aggregation chamber in which the sputter target is located may basically be used.

It is also possible to set the operating parameters, especially the pressure and the sputtering rate, in such a way that the cluster formation takes place in the direct surrounding of the sputter target. However, this means a restriction with respect to the possibility to vary the coating conditions and therefore is less preferred.

The apparatus represented in FIG. 1 is assembled essentially symmetrically with respect to the axis defined by the acceleration path 28a. This is suitable and simple but not necessary in every case. However, it is necessary that the aperture 9 between aggregation chamber 4 and acceleration chamber 5 is located in the extension of acceleration path 28a (contrary to the direction of flight of the particles) so that the clusters formed in chambers 3 and 4 are fed to the acceleration path.

Figure 2:
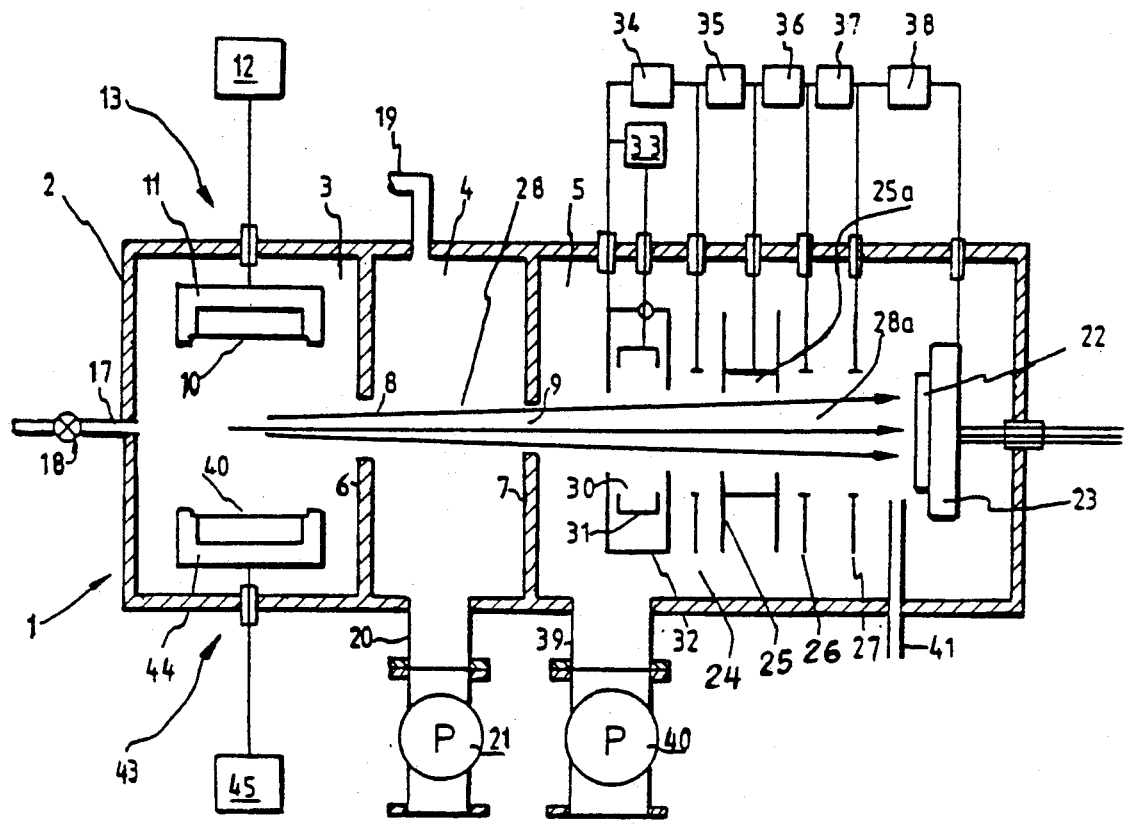
FIG. 2 is a cross-sectional representation of an alternative embodiment.

For increasing the yield or for producing layers consisting of several components, a plurality of sputters units may be used, as represented in FIG. 2. In addition to sputter unit 13, a second sputter unit 43 is provided, consisting of a sputter target 40, a holding means 44 and a voltage supply 45.

When using different sputter target materials for both sputter units, mixture clusters and mixture coatings can be produced; a combination of copper in one sputter unit and tungsten in the other sputter unit gives a thermically high-duty copper-tungsten layer which towards the end of the coating can be coated with a pure tungsten layer by switching off the atomizing unit working with copper. If instead of tungsten a carbon sputter unit is used, a diamond-like coating is achieved. It can be seen that the possible rapid control of the coating process provides a large plurality of variations.

Figure 3:
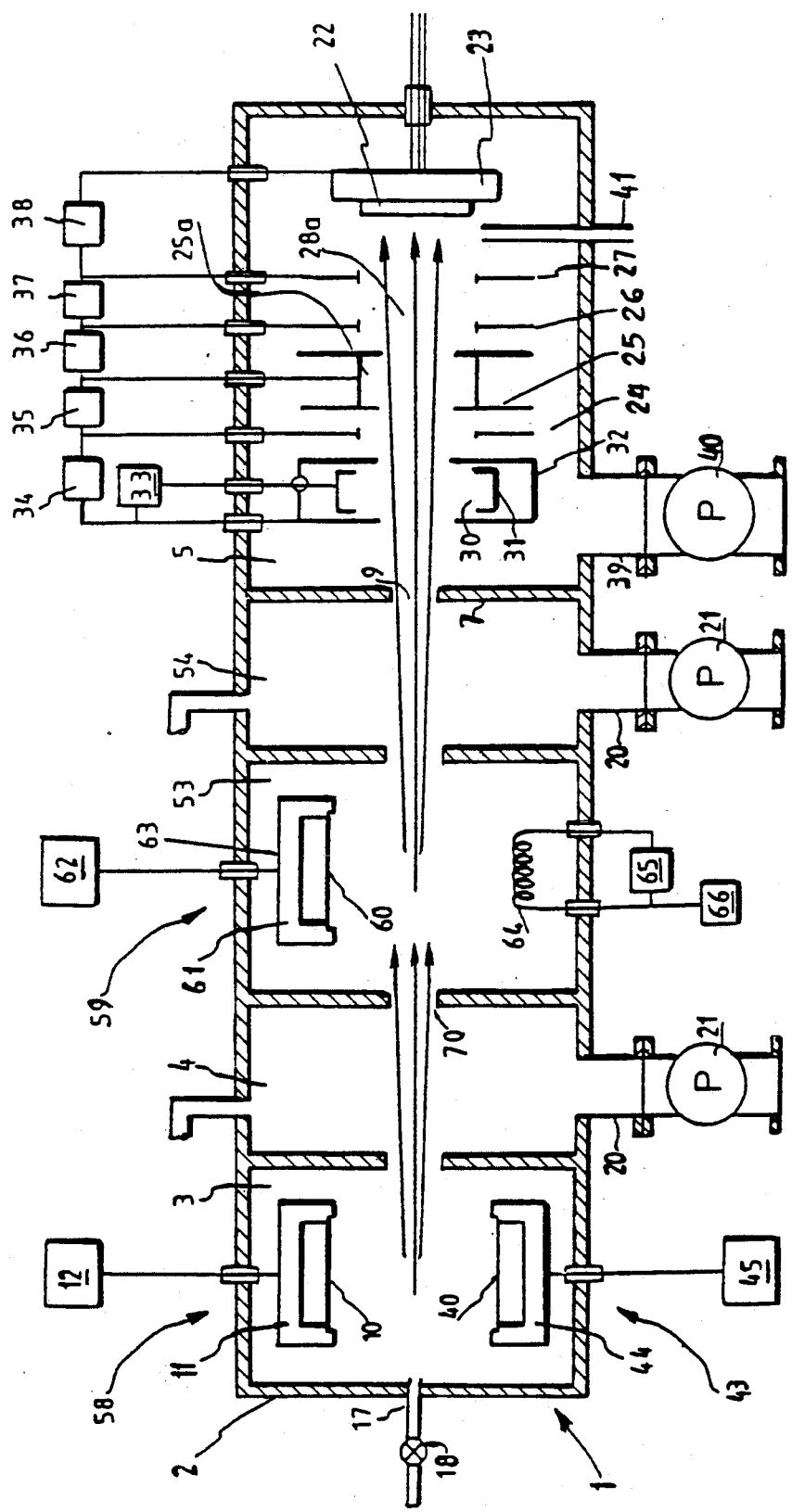
FIG. 3 is a cross-sectional representation of a second alternative embodiment.

The ion-cluster-epitaxy device represented in FIG. 3 is modified in that there are provided two cluster formation means 58,59, each consisting of a sputter chamber 3,53 and an aggregation chamber 4,54. Each contains units as represented in FIGS. 2 or 1, respectively. The sputter unit of the second cluster formation unit has the number 63 and consists of a sputter target 60, a holding means 61 and a voltage supply 62. A heated filament 64 with pertinent supply 65,66 supports the sputtering process.

The second cluster formation means is arranged at the flight path of the clusters from the first cluster formation means to the acceleration path. Clusters emerging from the first cluster formation means and passing through aperture 70 between the two clusters formation units thereby can be coated with an additional layer. Targets 10 and 40 may consist e.g. of copper so that pure copper clusters pass through aperture 70. Target 60 may consist of tungsten for coating clusters with an additional tungsten layer. Hence, it becomes possible to produce layers of substances which in general cannot be mixed. A specific case of application of such a device is the production of inhomegeneous layers with susceptibilities of higher order for optical applications, e.g. doubling the frequency for lasers.

Numerous further modifications of the invention are readily available to the skilled man. Two or more cluster-ion-epitaxy-systems according to one of FIGS. 1 to 3 may be combined in a parallel way for coating the same layer. It may also be suitable to combine the process according to the invention with conventional processes, such as if mixed layers with low-melting materials have to be produced, for which partially conventional methods are especially suitable.

We claim:

1. An apparatus for producing a thin layer of coating material on a substrate, comprising:
    a vacuum chamber containing means for holding a substrate, cluster formation means for generating clusters of a coating material, ionization means for ionizing the clusters and acceleration means having at least one electrode for accelerating cluster ions with an electric field along an acceleration path in a direction to the substrate,
    wherein the cluster formation means comprises a sputter unit having a sputter target composed of the coating material in solid form for transferring the coating material into a gas phase and means forming an aggregation chamber having means for supplying a gas,
    wherein the acceleration means comprises means forming an acceleration chamber separated from the aggregation chamber and in communication with the aggregation chamber via an aperture for receiving he clusters travelling along the acceleration path,
    a vacuum pump connected to the acceleration chamber and
    means for controlling the vacuum pump and the means for supplying gas to set a gas atmosphere in the aggregation chamber to a pressure of at leas 1 Pa to effect formation of the clusters of the coating material based on collisions of the sputtering generated particles with gas atoms.

2. The apparatus according to claim 1, wherein the sputter unit comprises a gas discharge sputter unit.

3. The apparatus according to claim 2, wherein the gas discharge sputter unit has a electron current generating means for increasing sputter yield.

4. The apparatus according to claim 1, wherein the sputter unit comprises means for generating an ion beam.

5. The apparatus according to claim 1, wherein the cluster formation means includes several sputter units.

6. The apparatus according to claim 1, further comprising means forming a sputter chamber separated from the aggregation chamber and in which the sputter target is disposed and means forming an aperture between the sputter chamber and the aggregation chamber for particles of the coating material produced during sputtering.

7. The apparatus according to claim 1, wherein the ionization means comprises an ionization unit separated from the sputter target and arranged at a flight path of the clusters from the aggregation chamber to the acceleration path.

8. The apparatus according to claim 7, wherein the ionization unit comprises a gas discharge ionization unit.

9. The apparatus according to claim 1, further comprising at least two cluster formation means disposed along a flight path of the clusters from a first cluster formation means to the acceleration path.

10. The apparatus according to claim 1, wherein the acceleration means comprises a plurality of electrodes having a distance from the acceleration path and having an operating voltage taken into consideration with the operating pressure in the acceleration chamber such that the energy taken up by atomic gas ions accelerated jointly with the clusters up to the next collision with a gas atom is sufficiently small that the ion charge exchange cross section is sufficiently high to decelerate the ions by charge exchange collisions and not damage the substrate when impinging.

11. A process for producing a thin layer of a coating material on a substrate, comprising the steps of generating of ionized clusters of the coating material and accelerating the clusters onto the substrate by an electric field, wherein the step of generating the ionized clusters comprises transferring the material into the gas phase by sputtering and transferring generated particles into a gas atmosphere having a pressure of at least 1 Pa in which clusters are formed by collision with gas atoms.

12. The process according to claim 11, wherein the step of sputtering comprises a gas discharge.

13. The process according to claim 11, wherein the steps of generating ionized clusters comprises temporarily ionizing the clusters at a spatially separated position from the generation by disposing an ionization device in a flight path thereof.

14. The process according to claim 11, wherein the step of sputtering comprises a plurality of sputtering units time dependently controlled independently of each other.

15. The process according to claim 11, further comprising coating the substrate by another coating process for coating the same layer.

16. The process according to claim 11, wherein the acceleration of the clusters is effected sufficiently slowly such that jointly accelerated gas ions are decelerated by charge exchange collisions with gas atoms.

17. The process according to claim 11, further comprising feeding gas for generating the clusters in a pulsating manner.

* * * * *